United States Patent
Ivan et al.

(10) Patent No.: US 10,811,639 B2
(45) Date of Patent: Oct. 20, 2020

(54) DISPLAY DEVICE AND A METHOD OF MANUFACTURING THE SAME

(71) Applicant: SAMSUNG DISPLAY CO., LTD., Yongin-si, Gyeonggi-Do (KR)

(72) Inventors: Maidanchuk Ivan, Yongin-si (KR); Minsu Lee, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/719,739

(22) Filed: Sep. 29, 2017

(65) Prior Publication Data

US 2018/0097204 A1  Apr. 5, 2018

(30) Foreign Application Priority Data

Sep. 30, 2016  (KR) .................. 10-2016-0126832

(51) Int. Cl.
  *H01L 51/52*  (2006.01)
  *H01L 27/32*  (2006.01)
  *H01L 51/56*  (2006.01)

(52) U.S. Cl.
  CPC ...... *H01L 51/5284* (2013.01); *H01L 27/3244* (2013.01); *H01L 51/5253* (2013.01); *H01L 51/5281* (2013.01); *H01L 51/56* (2013.01); *H01L 2251/5315* (2013.01)

(58) Field of Classification Search
  None
  See application file for complete search history.

(56) References Cited

U.S. PATENT DOCUMENTS

| | | | | |
|---|---|---|---|---|
| 5,932,354 | A | * | 8/1999 | Takeda ................ C03C 17/3417 359/359 |
| 2008/0157655 | A1 | * | 7/2008 | Choi .................... G02B 5/3083 313/504 |
| 2010/0232162 | A1 | * | 9/2010 | Shin ...................... H01L 27/322 362/293 |
| 2011/0121271 | A1 | | 5/2011 | Jeon et al. |
| 2012/0241811 | A1 | | 9/2012 | Kim et al. |
| 2015/0069372 | A1 | | 3/2015 | Kim et al. |
| 2017/0222183 | A1 | * | 8/2017 | Cho .................... H01L 51/5259 |

FOREIGN PATENT DOCUMENTS

| | | |
|---|---|---|
| KR | 10-2011-0058126 | 6/2011 |
| KR | 10-2012-0000042 | 1/2012 |
| KR | 10-2012-0109083 | 10/2012 |

* cited by examiner

*Primary Examiner* — Nilufa Rahim
(74) *Attorney, Agent, or Firm* — F. Chau & Associates, LLC (57) ABSTRACT

A display device includes a substrate, a pixel electrode, an encapsulation layer, and a light-shielding layer. The pixel electrode is positioned above the substrate. The encapsulation layer is disposed over the pixel electrode. The encapsulation layer includes a first inorganic layer. The first inorganic layer includes a plurality of fine pillar patterns. The pillar patterns are sloped with respect to one surface of the substrate. The light-shielding layer is disposed on the encapsulation layer. The light-shielding layer includes a first opening. The first opening overlaps at least a portion of the pixel electrode.

18 Claims, 6 Drawing Sheets

FIG. 7

DISPLAY DEVICE AND A METHOD OF MANUFACTURING THE SAME

CROSS-REFERENCE TO RELATED APPLICATION

This application claims priority under 35 U.S.C. § 119 to Korean Patent Application No. 10-2016-0126832, filed on Sep. 30, 2016 in the Korean Intellectual Property Office, the disclosure of which is incorporated by reference herein in its entirety.

TECHNICAL FIELD

Exemplary embodiments of the present invention relate to a display device, and more particularly to a method of manufacturing the same.

DISCUSSION OF RELATED ART

Display devices may be media capable of connecting users to information. Display devices have various forms. For example, organic light-emitting display devices are a type of display device and may have relatively high performance. Organic light-emitting display devices may have a relatively slim profile, be relatively lightweight, and have relatively low power consumption.

As outdoor use of an information-oriented apparatus increases, the exposure time of such display devices to natural light may increase. Natural light incident into the display devices may be relatively easily reflected by each of an opposite electrode, a pixel electrode, and a metallic layer of a thin film transistor of the display device. When the reflection becomes relatively high, brightness or contrast of the display device may deteriorate due to reflected light. Thus, it may be relatively difficult for a user to view a displayed image.

SUMMARY

One or more exemplary embodiments of the present invention include a display device which may increase brightness and outdoor display visibility by, for example, reducing reflectivity of a pixel area, and a method of manufacturing the display device.

One or more exemplary embodiments of the present invention provide a display device. The display device includes a substrate, a pixel electrode, an encapsulation layer, and a light-shielding layer. The pixel electrode is positioned above the substrate. The encapsulation layer is disposed above the pixel electrode. The encapsulation layer includes a first inorganic layer. The first inorganic layer includes a plurality of fine pillar patterns. The fine pillar patterns slope with respect to one surface of the substrate. The light-shielding layer is disposed on the encapsulation layer. The light-shielding layer includes a first opening. The first opening overlaps at least a portion of the pixel electrode.

The encapsulation layer may include at least one inorganic layer. The at least one inorganic layer may include the first inorganic layer. The first inorganic layer may be adjacent to the light-shielding layer.

The first inorganic layer may include silicon oxide.

The first inorganic layer may have a refractive index ranging from about 1.0 to about 1.5.

The first inorganic layer may be porous.

The encapsulation layer may further include a second inorganic layer. The second inorganic layer may be in direct contact with the first inorganic layer.

The second inorganic layer may have a refractive index greater than a refractive index of the first inorganic layer.

The second inorganic layer may be less porous than the first inorganic layer.

The second inorganic layer may include silicon nitride, titanium oxide, tantalum oxide, zirconium oxide, aluminum oxide, silicon oxide, silicon oxynitride, aluminum oxynitride, aluminum oxynitride, zinc oxide, or a combination thereof.

The first inorganic layer may include a first slope layer and a second slope layer. The first slope layer and the second slope layer may each have a stacked structure. The first slope layer may include a plurality of first fine pillar patterns. The second slope layer may include a plurality of second fine pillar patterns. The first fine pillar patterns may have a slope direction different from a slope direction of the second fine pillar patterns.

A first fine pillar pattern of the first fine pillar patterns and a second fine pillar pattern of the second fine pillar patterns may form a V-shape with each other.

The first fine pillar patterns and the second fine pillar patterns may be substantially symmetrically arranged around a boundary surface. The boundary surface may be disposed between the first slope layer and the second slope layer.

The first fine pillar patterns or the second fine pillar patterns may have a slope angle. The slope angle may range from about 45 degrees to about 80 degrees with respect to the one surface of the substrate.

The first inorganic layer may include a second opening. The second opening may expose at least a portion of a lower layer. The lower layer may be positioned below the first inorganic layer. The lower layer may be in direct contact with the first inorganic layer. At least a central portion of the first opening might not overlap at least a central portion of the second opening.

The lower layer may have a refractive index greater than a refractive index of the first inorganic layer.

The lower layer may be less porous than the first inorganic layer.

The light-shielding layer may include a light-absorbing material.

One or more exemplary embodiments of the present invention provide a method of manufacturing a display device. The method includes arranging a pixel electrode above a substrate. A first inorganic layer is formed above the pixel electrode. The first inorganic layer includes a plurality of fine pillar patterns. The fine pillar patterns slope with respect to one surface of the substrate. A light-shielding layer is formed on the first inorganic layer. The light-shielding layer includes a first opening. The first opening overlaps at least a portion of the pixel electrode.

The forming of the first inorganic layer may include forming the fine pillar patterns by performing a deposition method. The deposition method may be performed in a direction of a slope incident angle predetermined on the one surface of the substrate.

The method may further include forming a second inorganic layer over or below the first inorganic layer such that the second inorganic layer is in direct contact with the first inorganic layer. The first inorganic layer may include silicon oxide. The second inorganic layer may include silicon nitride, titanium oxide, tantalum oxide, zirconium oxide, aluminum oxide, silicon oxide, silicon oxynitride, aluminum oxynitride, aluminum oxynitride, zinc oxide, or a combination thereof.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION OF THE EMBODIMENTS

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings.

It will be understood that although the terms "first" and "second" may be used herein to describe various components, these components should not be limited by these terms.

Sizes of elements in the drawings may be exaggerated for clarity of description.

It will be understood that when a component, such as a layer, a film, a region, or a plate, is referred to as being "on" another component, the component can be directly on the other component or intervening components may be present.

Figure 1:
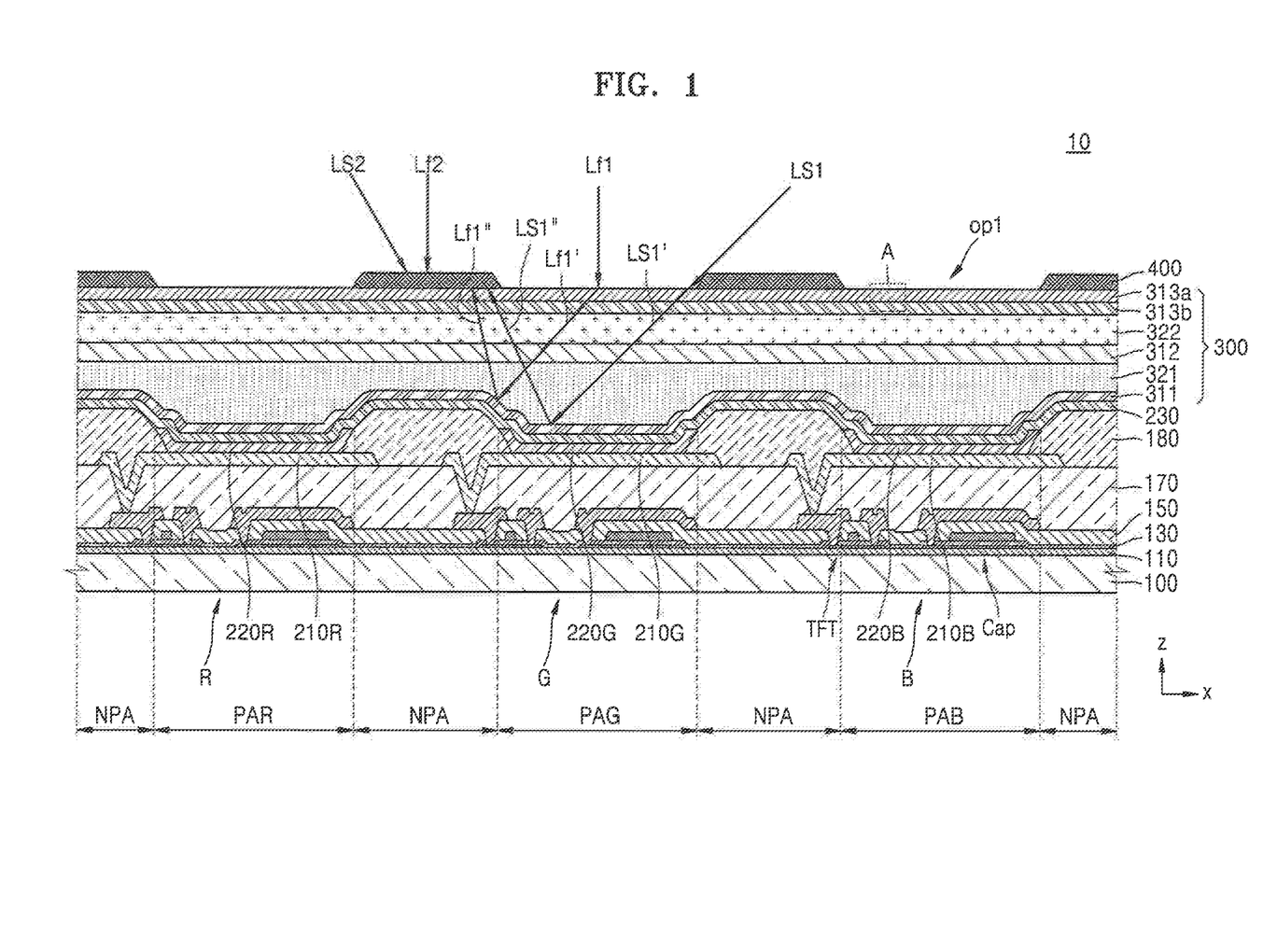
FIG. 1 is a cross-sectional view illustrating a display device according to an exemplary embodiment of the present invention.
Figure 2:
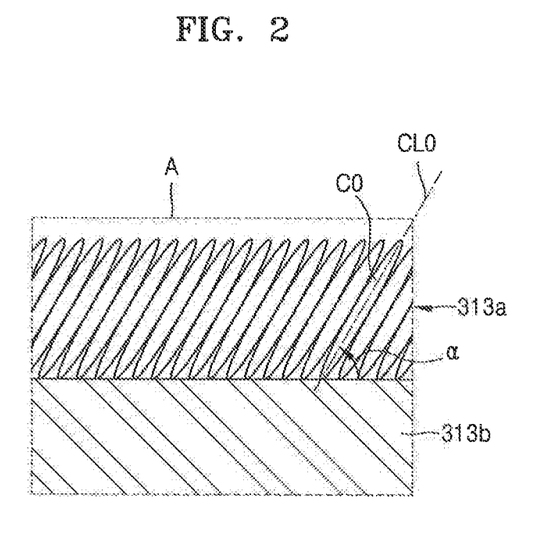
FIG. 2 is an enlarged cross-sectional view illustrating a portion A of FIG. 1 according to an exemplary embodiment of the present invention.
Figure 3:
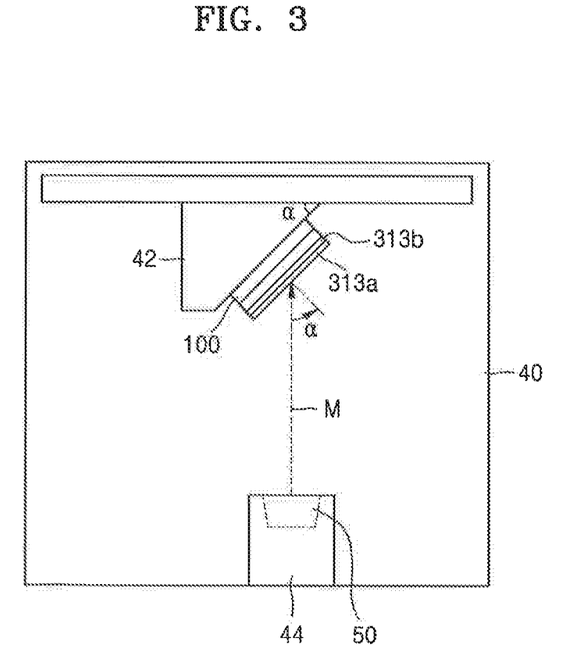
FIG. 3 is a view illustrating a portion of a deposition process of manufacturing a display device according to an exemplary embodiment of the present invention.

FIG. 1 is a cross-sectional view illustrating a display device according to an exemplary embodiment of the present invention. FIG. 2 is an enlarged cross-sectional view illustrating a portion A of FIG. 1 according to an exemplary embodiment of the present invention. FIG. 3 is a view illustrating a portion of a deposition process of manufacturing a display device according to an exemplary embodiment of the present invention.

Referring to FIGS. 1 to 3, a display device 10 may include a substrate 100, a plurality of pixel electrodes 210R, 210G, and 210B, an encapsulation layer 300, and a light-shielding layer 400.

Referring to FIG. 1, the substrate 100 may include various materials such as a glass material, a metallic material, or a plastic material. The substrate 100 may include a plurality of pixel areas PAR, PAG, and PAB. The substrate 100 may include a plurality of non-pixel areas NPA. The pixel areas PAR, PAG, and PAB may be spaced apart from each other on the substrate 100. The pixel areas PAR, PAG, and PAB may indicate areas of the substrate 100 in which central portions of pixels are arranged. The non-pixel areas NPA may indicate areas of the substrate 100 between the pixel areas PAR, PAG, and PAB.

The pixel electrodes 210R, 210G, and 210B may be respectively arranged in the pixel areas PAR, PAG, and PAB. The pixel electrodes 210R, 210G, and 210B may be positioned above relatively wider areas than areas the pixel areas PAR, PAG, and PAB are disposed. At least central portions of the pixel electrodes 210R, 210G, and 210B may be respectively arranged inside the pixel areas PAR, PAG, and PAB. A pixel-defining layer 180 may overlap at least a portion of each of the non-pixel areas NPA. The pixel-defining layer 180 may have a shape protruding from the substrate 100 (e.g., in a +Z direction). The pixel-defining layer 180 may have a shape protruding from the substrate 100 farther than the pixel electrodes 210R, 210G, and 210B.

Referring to FIG. 1, a thin film transistor (TFT) or a capacitor Cap may be disposed over the substrate 100. A buffer layer 110 may be positioned above the substrate 100. The buffer layer 110 may reduce or prevent impurities from penetrating into a semiconductor layer of the TFT. A gate insulating layer 130 may be positioned above the substrate 100. The gate insulating layer 130 may insulate the semiconductor layer from a gate electrode of the TFT. An interlayer insulating layer 150 may be positioned above the substrate 100. The interlayer insulating layer 150 may insulate a source electrode and a drain electrode of the TFT from a gate electrode of the TFT. A planarization layer 170 may be disposed over the substrate 100. The planarization layer 170 may cover the TFT. The planarization layer 170 may have a substantially flat upper surface.

The TFT may be electrically connected to a plurality of display elements. The TFT may be configured drive or control the display elements. The display elements may have various forms such as organic light-emitting elements or liquid crystal elements. As an example, an organic light-emitting display device including an organic light-emitting device as a display element will be described in more detail below.

The pixel electrodes 210R, 210G, and 210B may be semi-transparent electrodes, transparent electrodes, or reflective electrodes. When the pixel electrodes are semi-transparent electrodes or transparent electrodes, the pixel electrodes 210R, 210G, and 210B may include indium tin oxide (ITO), indium zinc oxide (IZO), zinc oxide (ZnO), indium oxide ($In_2O_3$), indium gallium oxide (IGO), or aluminum zinc oxide (AZO). When the pixel electrodes 210R, 210G, and 210B are reflective electrodes, the pixel electrodes 210R, 210G, and 210B may include a reflective layer. The reflective may include silver (Ag), magnesium (Mg), aluminum (Al), platinum (Pt), palladium (Pd), gold (Au), nickel (Ni), neodymium (Nd), iridium (Ir), chromium (Cr), or a compound thereof. The pixel electrodes 210R, 210G, and 210B may include a layer including ITO, IZO, ZnO, or $In_2O_3$. The configuration and the material of the pixel electrodes 210R, 210G, and 210B are not limited thereto and may variously changed.

The pixel-defining layer 180 may define pixels. The pixel-defining layer 180 may define pixels by including openings respectively corresponding to pixels R, G, and B. For example, the pixel defining layer 180 may include openings respectively exposing central portions of the pixel electrodes 210R, 210G, and 210B. Alternatively, the pixel defining layer 180 may include openings respectively exposing substantially the entire surfaces of the pixel electrodes 210R, 210G, and 210B. By increasing distances between ends of the pixel electrodes 210R, 210B, and 210G from an opposite electrode 230 positioned above the pixel electrodes 210R, 210B, and 210G, the pixel-defining layer 180 may reduce or prevent, for example, an arc from occurring at ends of the pixel electrodes 210R, 210G, and 210B.

Intermediate layers 220R, 220G, and 220B may be respectively disposed on the pixel electrodes 210R, 210G, and 210B. The intermediate layers 220R, 220G, and 220B may have a multi-layered structure. The multi-layered structure may include an emission layer. Some of the intermediate layers 220R, 220G, and 220B may be common layers. The common layers may be positioned above substantially the entire surface of the substrate 100. Alternatively, some of the other intermediate layers 220R, 220G, and 220B may be patterned layers. The patterned layers may correspond to the pixel electrodes 210R, 210G, and 210B. The intermediate layers 220R, 220G, and 220B may each include a relatively low molecular material or a polymer material. The intermediate layers 220R, 220G, and 220B may each include a hole injection layer, a hole transport layer, an emission layer, an electron transport layer, and/or an electron injection layer. The intermediate layers 220R, 220G, and 22B may be formed by using various methods such as deposition, spin coating, inkjet printing, and/or laser thermal transfer.

The opposite electrode 230 may be disposed on the intermediate layers 220R, 220G, and 220B. The opposite electrode 230 may be a semi-transparent electrode, a transparent electrode or a reflective electrode. When the opposite electrode 230 is a semi-transparent electrode or a transparent electrode, the opposite electrode 230 may include a layer including a metal. The metal may have a relatively small work function. For example, the metal may include Li, Ca, LiF/Ca, LiF/Al, Al, Ag, Mg, or a compound thereof. When the opposite electrode 230 is a semi-transparent electrode or a transparent electrode, the opposite electrode 230 may include a conductive layer. The conductive layer may include ITO, IZO, ZnO, or $In_2O_3$. When the opposite electrode 230 is a reflective electrode, the opposite electrode 230 may include a layer including Li, Ca, LiF/Ca, LiF/Al, Al, Ag, Mg, or a compound thereof. The configuration and the material of the opposite electrode 230 are not limited thereto and may be variously changed.

An encapsulation layer 300 may be disposed on the opposite electrode 230. The encapsulation layer 300 may protect display elements including the pixel electrodes 210R, 210G, and 210B, the intermediate layers 220R, 220G, and 220B, and the opposite electrode 230 from impurities such as external oxygen or moisture.

The encapsulation layer 300 may include at least one inorganic layer and at least one organic layer. The encapsulation layer 300 may have a structure in which the inorganic layers and the organic layers are repeatedly and alternately stacked. In an exemplary embodiment of the present invention, the encapsulation layer 300 may include a first inorganic layer 313a. The first inorganic layer 313a may be an uppermost layer of the encapsulation layer 300. The encapsulation layer 300 may include a second inorganic layer 313b, a third inorganic layer 312, and a fourth inorganic layer 311. The second inorganic layer 313b, the third inorganic layer 312, and the fourth inorganic layer 311 may be sequentially stacked below the first inorganic layer 313a. A first organic layer 322 may be disposed between the second inorganic layer 313b and the third inorganic layer 312. A second organic layer 321 may be disposed between the third inorganic layer 312 and the fourth inorganic layer 311. The first inorganic layer 313a may be in direct contact with the second inorganic layer 313b. Thus, an uppermost layer of the encapsulation layer 300 may have a structure in which two inorganic layers are stacked. When the uppermost layer of the encapsulation layer 300 includes the inorganic layers, moisture transmission or oxygen penetration into the display elements may be reduced or prevented. However, exemplary embodiments of the present invention are not limited thereto. For example, the uppermost layer of the encapsulation layer 300 may include an organic layer.

Referring to FIG. 2, the first inorganic layer 313a may include a plurality of fine pillar patterns C0. The fine pillar patterns C0 may slope with respect to a surface of the substrate 100. Each of the fine pillar patterns C0 may have a long pillar shape. The long pillar shape may have a relatively longer length than a diameter or width of a cross-section of the pillar. An angle of a central line CL0 with respect to one surface of the substrate 100 may be defined as a slope incident angle $\alpha$, the central line CL0 passing through the center of the fine pillar pattern C0 and extending in a lengthwise direction. The one surface of the substrate 100 may be an upper surface or a lower surface of the substrate 100 extending in an X-axis direction. For example, when the second inorganic layer 313b positioned below the first inorganic layer 313a is substantially parallel to the one surface of the substrate 100, the central line CL0 of the fine pillar pattern C0 may slope with respect to the upper surface of the second inorganic layer 313b by the slope incident angle $\alpha$. For example, the slope incident angle $\alpha$ may be in a range of from about 45° or more to about 80° or less. As the slope incident angle $\alpha$ increases, porosity may increase and an effective refractive index may be reduced.

A method of forming the plurality of fine pillar patterns C0 on the second inorganic layer 313b is described in more detail below. Referring to FIG. 3, a deposition material M may be deposited over the substrate 100 in a relatively sloped direction within a chamber 40. The chamber 40 may be configured to provide an enclosed environment from the outside. According to an exemplary embodiment of the present invention, a substrate holder 42 may be disposed in an upper portion of the chamber 40. The substrate holder 42 may support the substrate 100. The second inorganic layer 313b may be disposed on the substrate 100 supported by the substrate holder 42. The substrate 100 may be supported and may slope by a predetermined angle $\alpha$. The predetermined angle $\alpha$ may be determined with respect to a lower surface or an upper surface of the chamber 40. The deposition material M may be discharged from a deposition nozzle 50. The deposition nozzle 50 may be positioned above an upper surface of a deposition source 44. The deposition source 44 may receive the deposition material M. The discharged deposition material M may reach the second inorganic layer 313b. Referring to FIG. 2, the first inorganic layer 313a including the fine pillar patterns C0 sloping by a predetermined angle with respect to the one surface of the substrate 100 may be disposed on the second inorganic layer 313b. The predetermined angle may be referred to as the slope incident angle $\alpha$. The slope incident angle $\alpha$ may be substantially the same as an angle between a deposition direction of the deposition material M and a direction substantially perpendicular to the one surface of the substrate 100 inside the chamber 40.

The first inorganic layer 313a formed by the above described process may be a layer in which the plurality of fine pillar patterns C0 are relatively densely arranged. The first inorganic layer 313a may have a porous structure, for example, due to spaces between the fine pillar patterns C0. As the slope incident angle α increases, the first inorganic layer 313a may have a relatively high porosity, for example, due to a pillar structure and a shadow effect. Thus, an effective refractive index of the first inorganic layer 313a may be reduced.

According to an exemplary embodiment of the present invention, the first inorganic layer 313a may include silicon oxide. As the fine pillar patterns C0 including silicon oxide are formed, the first inorganic layer 313a has porosity and may have a relatively low refractive index. The refractive index of the first inorganic layer 313a may range from about 1.0 or more to about 1.5 or less, for example, from about 1.05 or more to about 1.44 or less. The first inorganic layer 313a may include a plurality of fine pillar patterns including a material with a relatively low refractive index. Silicon oxide may be omitted from the first inorganic layer 313a.

The second inorganic layer 313b positioned below the first inorganic layer 313a may be a general deposition layer. Thus, the second inorganic layer 313b might not have a fine pattern structure similar to the first inorganic layer 313a. Since the second inorganic layer 313b may include a solid material, the second inorganic layer 313b may have a relatively greater refractive index than the refractive index of the first inorganic layer 313a.

According to an exemplary embodiment of the present invention, the second inorganic layer 313b, the third inorganic layer 312, and the fourth inorganic layer 311 may each include metallic oxide, metallic nitride, metallic oxynitride, or any combination thereof. For example, the second inorganic layer 313b may include silicon nitride, titanium oxide, tantalum oxide, zirconium oxide, aluminum oxide, silicon oxide, silicon oxynitride, aluminum oxynitride, aluminum nitride, or zinc oxide.

The second inorganic layer 313b may have a relatively lower porosity than a porosity of the first inorganic layer 313a. The second inorganic layer 313b may have a relatively low refractive index. For example, the second inorganic layer 313b may have a refractive index ranging from about 1.8 or more to about 2.0 or less.

Since the inorganic layers having a stacked structure including the first inorganic layer 313a having a relatively low refractive index and the second inorganic layer 313b having a relatively high refractive index as an uppermost layer of the encapsulation layer 300, the uppermost layer may serve as a reflection prevention layer. Additionally, the uppermost layer of the encapsulation layer 300 may serve as a layer reducing or preventing moisture transmission or oxygen penetration into the display device 10.

Although the first inorganic layer 313a having a relatively low refractive index may be disposed on the second inorganic layer 313b having a relatively high refractive index, exemplary embodiments of the present invention are not limited thereto. For example, the second inorganic layer 313b may be disposed on the first inorganic layer 313a. To reduce or prevent total reflection from occurring due to a difference between the refractive index of the first inorganic layer 313a and the refractive index of the second inorganic layer 313b, an intermediate refractive index layer may be disposed between the first inorganic layer 313a and the second inorganic layer 313b. However, since the encapsulation layer 300 may become relatively thick, the encapsulation layer 300 may reduce light efficiency. Thus, a number and a thickness of the inorganic layers may be variously modified.

The first organic layer 322 and the second organic layer 321 of the encapsulation layer 300 may each include a polymer material. The first and second organic layers 322 and 321 may each have a single layered structure or a multi-layered structure. The first and second organic layers 322 and 321 may each include polyethylene terephthalate, polyimide, polycarbonate, epoxy, polyethylene, or polyacrylate.

The light-shielding layer 400 may be disposed on the encapsulation layer 300. According to an exemplary embodiment of the present invention, the light-shielding layer 400 may be in direct contact with the uppermost layer of the encapsulation layer 300. When the uppermost layer of the encapsulation layer 300 is the first inorganic layer 313a, the first inorganic layer 313a may be in direct contact with the light-shielding layer 400. When the uppermost layer of the encapsulation layer 300 is an organic layer, the first inorganic layer 313a might not be in direct contact with the light-shielding layer 400. However, the first inorganic layer 313a may be relatively closest to the light-shielding layer 400 among the inorganic layers included in the encapsulation layer 300.

The light-shielding layer 400 may include a plurality of first openings op1. The first openings op1 may be respectively arranged at the central portions of the pixel areas PAR, PAG, and PAB. Since the first openings op1 may be respectively arranged in each of the pixel areas PAR, PAG, and PAB, the first openings op1 may respectively overlap each of the pixel electrodes 210R, 210G, and 210B.

Regions of the light-shielding layer 400 between adjacent first openings op1 may each include a light-absorbing material. The light-absorbing material of the light-shielding layer 400 may include an organic material. The organic material may include a black pigment. The light-shielding layer 400 may reduce or prevent external light from penetrating into the display device 10, for example, by absorbing the external light. The light-shielding layer 400 may reduce or prevent reflected light from being emitted to outside of the display device 10, for example, by absorbing light reflected by the opposite electrode 230 from transmitted external light.

The light-shielding layer 400 may reduce or prevent color mixing, for example, by preventing a portion of light emitted from one of the pixel areas PAR, PAG, and PAB from penetrating into adjacent pixel areas. Additionally, the light-shielding layer 400 may reduced or prevent a blurring phenomenon which may blur an image by, for example, controlling emitted light of an adjacent pixel to area emitting light of substantially the same color.

Since the stacked structure including each of the first inorganic layer 313a and the second inorganic layer 313b may be positioned below the light-shielding layer 400, external light may be prevented from being reflected by the opposite electrode 230 of the display device 10.

Referring to FIG. 1, in each of the green pixel area PAG and a non-pixel area NPA adjacent thereto, frontal light Lf1 from a frontal direction of the display device 10 to the green pixel area PAG may be guided to a direction sloping with respect to one surface of the substrate 100 (e.g., an X-axis direction) along spaces between the plurality of fine pillar patterns C0 of the first inorganic layer 313a. First guided light Lf1' guided via the porous structure of the first inorganic layer 313a may be directed toward the pixel-defining layer 180 and may be incident to the opposite electrode 230. Thus, the first guided light Lf1' might not be directed toward the green pixel electrode 220G. Therefore, the first reflected light Lf1" reflected by a portion of the opposite electrode 230 adjacent to the non-pixel area NPA may be more easily absorbed by a light-absorbing pattern of the light-shielding layer 400 in the non-pixel area NPA.

Lateral light LS1 incident from a lateral direction of the display device 10 to the green pixel area PAG may travel in a direction similar to the lateral direction along the spaces between the fine pillar patterns C0 of the first inorganic layer 313a. Second guided light LS1' guided via the porous structure of the first inorganic layer 313a may be relatively obliquely incident to a portion of the opposite electrode 230 over the green pixel electrode 220G. Thus, second reflected light LS1" reflected by the opposite electrode 230 may be more easily absorbed by the light-absorbing pattern of the light-shielding layer 400.

In contrast, each of the frontal light Lf2 and lateral light LS2 incident to the non-pixel area NPA may be absorbed by the light-absorbing pattern of the light-shielding layer 400. Thus, each of the frontal light Lf2 and lateral light LS2 might not penetrate into the display device 10.

Therefore, since the first inorganic layer 313a may change a progression direction of external light incident to the pixel area PAG, reflected light of the external light may be substantially absorbed by the light-shielding layer 400. Thus, reflected light of the external light might not be emitted to outside of the display device 10. Most of external light incident to the non-pixel area NPA may be initially absorbed by the light-shielding layer 400. Thus, an occurrence of reflected light of the external light may be reduced or prevented. Therefore, external emission of reflected light of external light may be reduced or eliminated. Thus, reflectivity of the display device 10 may be reduced. A difference in reflectivity between the pixel area PAG and the non-pixel area NPA may be reduced. The display device 10 may display a relatively high brightness image over substantially the entire surface thereof.

Figure 4:
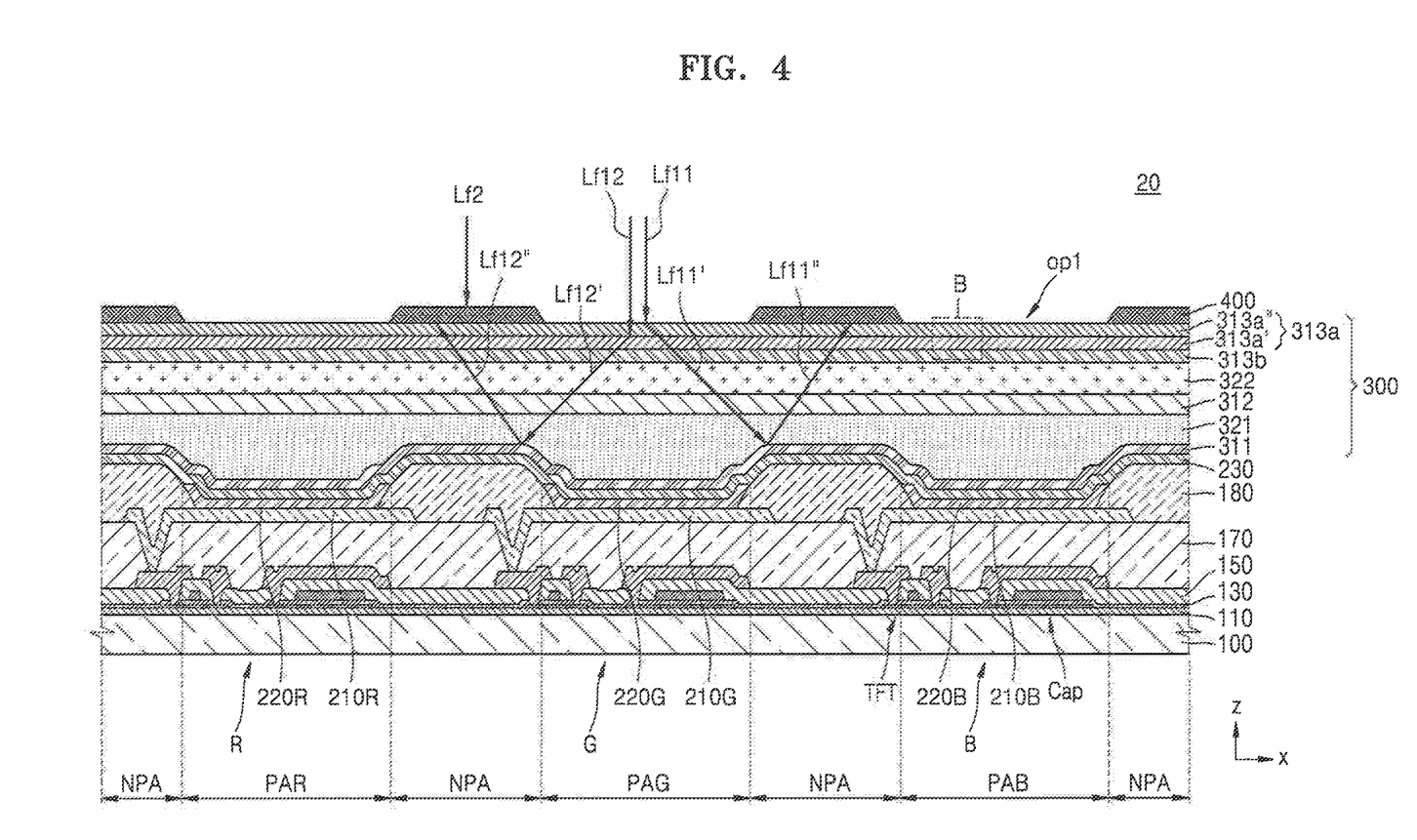
FIG. 4 is a cross-sectional view illustrating a display device according to an exemplary embodiment of the present invention.
Figure 5:
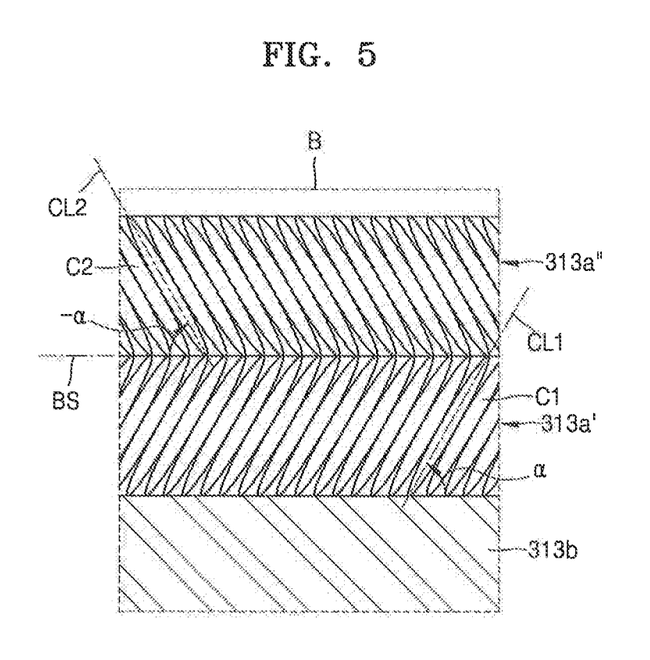
FIG. 5 is an enlarged cross-sectional view illustrating a portion B of FIG. 4 according to an exemplary embodiment of the present invention.
Figure 6:
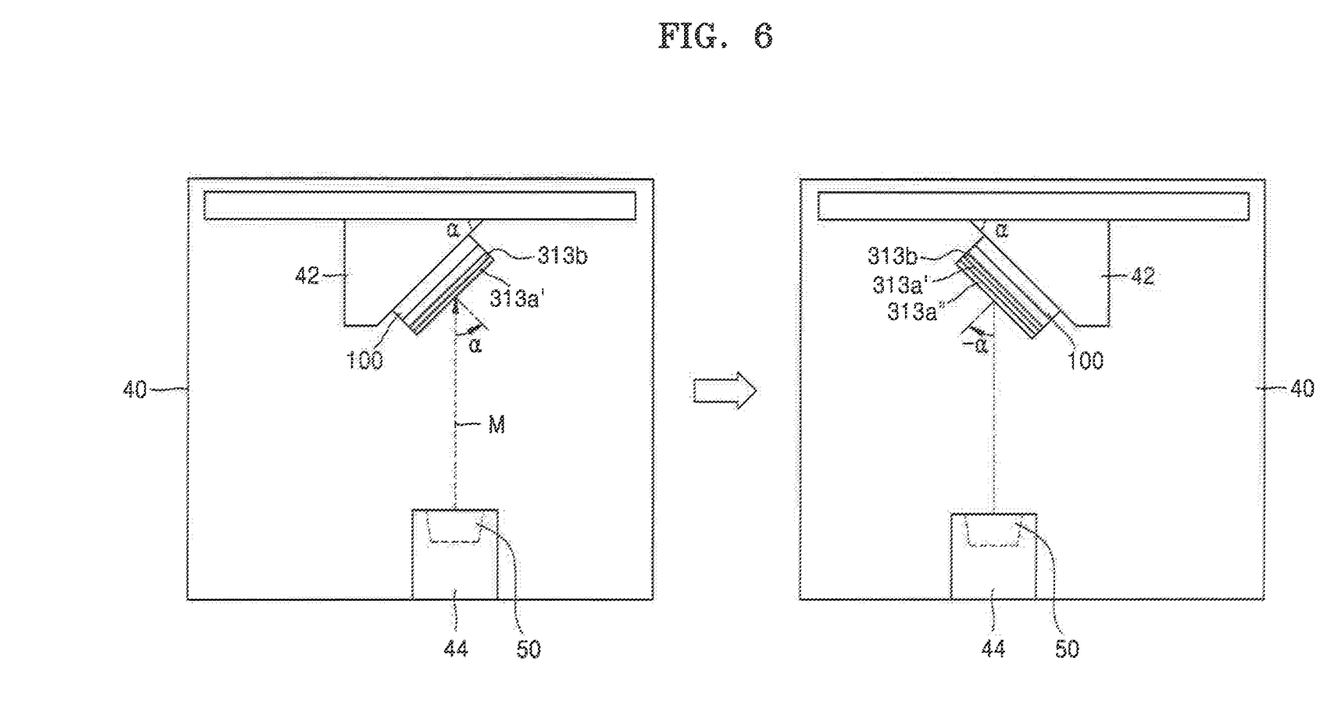
FIG. 6 is a view illustrating a portion of a deposition process of manufacturing a display device according to an exemplary embodiment of the present invention.

FIG. 4 is a cross-sectional view illustrating a display device according to an exemplary embodiment of the present invention. FIG. 5 is an enlarged cross-sectional view illustrating a portion B of FIG. 4 according to an exemplary embodiment of the present invention. FIG. 6 is a view illustrating a portion of a deposition process of manufacturing a display device according to an exemplary embodiment of the present invention.

Referring to FIGS. 4 to 6, a display device 20 may include the substrate 100, the plurality of pixel electrodes 210R, 210G, and 210B, the encapsulation layer 300, and the light-shielding layer 400. An inorganic layer of the encapsulation layer 300 adjacent to the light-shielding layer 400 may include three stacked layers; however, exemplary embodiments of the present invention are not limited thereto. The display device 20 described with reference to FIGS. 4 to 6 may be substantially the same as the display device 10 described above with reference to FIGS. 1 to 3, and thus duplicative descriptions may be omitted below, and differences between the display device 20 and the display device 10 may be focused on below.

Referring to FIG. 4, the display device 20 may include an encapsulation layer 300. An uppermost layer of the encapsulation layer 300 may include the first inorganic layer 313a and the second inorganic layer 313b. The first inorganic layer 313a and the second inorganic layer 313b may have a stacked structure. The first inorganic layer 313a may include a first slope layer 313a' and a second slope layer 313a". The first slope layer 313a' and the second slope layer 313a" may each have a stacked structure.

Referring to FIG. 5, the first slope layer 313a' may include a plurality of first fine pillar patterns C1. The second slope layer 313a" may include a plurality of second fine pillar patterns C2. The first fine pillar patterns C1 and the second fine pillar patterns C2 may each slope with respect to one surface of the substrate 100 (e.g., the X-axis direction). A sloped direction of the first fine pillar patterns C1 may be different from a sloped direction of the second fine pillar patterns C2. Thus, an angle between one surface of the substrate 100 and a central line CL1 passing through the center of the first fine pillar pattern C1 and extending lengthwise may be a positive (+) angle. An angle between one surface of the substrate 100 and a central line CL2 passing through the center of the second fine pillar pattern C2 and extending lengthwise may be a negative (−) angle. The angle may refer to an acute angle greater than 0° and less than 90°. The positive angle may be defined in a counterclockwise direction in the drawings. The negative angle may be defined in a clockwise direction in the drawings.

According to an exemplary embodiment of the present invention, the first fine pillar patterns C1 and the second fine pillar patterns C2 may form a V-shape with each other when viewed from the X-axis direction. Thus, ends of the first fine pillar patterns C1 may be in direct contact with ends of the second fine pillar patterns C2 at a boundary surface BS. The boundary surface BS may be between the first slope layer 313a' and the second slope layer 313a". A space between adjacent first fine pillar patterns C1 may be connected to a space between adjacent second fine pillar patterns C2. Thus, the stacked structure of the first slope layer 313a' and the second slope layer 313a" may have a porosity of a predetermined level.

According to an exemplary embodiment of the present invention, the first fine pillar patterns C1 and the second fine pillar patterns C2 may each be relatively symmetric with respect to the boundary surface BS between the first slope layer 313a' and the second slope layer 313a". When the first fine pillar patterns C1 have a positive slope angle α, the second fine pillar patterns C2 may have a negative slope angle −α.

A method of forming each of the first fine pillar patterns C1 and the second fine pillar patterns C2 on the second inorganic layer 313b will be described in more detail below. Referring to FIG. 6, a deposition material M may be deposited over the substrate 100 inside the chamber 40. The deposition material M may be deposited such that the deposition material M slopes at a positive angle. Thus, the substrate 100 may be supported and may slope by a predetermined positive angle α by the substrate holder 42. The predetermined positive angle α may be with respect to a ground surface or a ceiling surface of the chamber 40. The deposition material M discharged from the deposition nozzle 50 of the deposition source 44 may reach the second inorganic layer 313b. By this process, the first slope layer 313a' may be formed. The substrate holder 42 may perform a substantially symmetrical displacement such that the substrate 100 is supported and slopes by a negative angle −α with respect to the ground surface or the ceiling surface of the chamber 40. The deposition material M discharged from the deposition nozzle 50 of the deposition source 44 may reach the second inorganic layer 313b. The second slope layer 313a" may be disposed on the first slope layer 313a' set in advance. A slope direction of the first fine pillar patterns C1 of the first slope layer 313a' may become different from a slope direction of the second fine pillar patterns C2 of the second slope layer 313a". The first slope layer 313a' and the second slope layer 313a" each may have a relatively high porosity. Thus, each of the first slope layer 313a' and the second slope layer 313a" may have a relatively low effective refractive index.

Since the stacked structure including the first slope layer 313a', the second slope layer 313a", and the second inorganic layer 313b may be positioned below the light-shielding layer 400, external light may be reduced or prevented from being reflected by the opposite electrode 230 of the display device 20.

Referring to FIG. 4, in each of the green pixel area PAG and the non-pixel area NPA adjacent thereto, frontal light Lf11 incident from a frontal direction of the display device 20 to the green pixel area PAG may be guided to a direction sloping with respect to one surface of the substrate 100 (e.g., an X-axis direction) along spaces between the plurality of second fine pillar patterns C2 of the second slope layer 313a". First guided light Lf11' guided via the porous structure of the second slope layer 313a" may be directed toward a protrusion portion of the pixel-defining layer 180. between the green pixel electrode 220G and the blue pixel electrode 220B and then is incident to the opposite electrode 230. Therefore, first reflected light Lf11" reflected by a portion of the opposite electrode 230 adjacent to the non-pixel area NPA may be more easily absorbed by a light-absorbing pattern of the light-shielding layer 400 in the non-pixel area NPA.

Similarly, second frontal light Lf12 incident from a frontal direction of the display device 20 to the green pixel area PAG may be guided to a direction sloping with respect to one surface of the substrate 100 (e.g., the X-axis direction) along spaces between the plurality of first fine pillar patterns C1 of the first slope layer 313a'. second guided light Lf12' guided via the porous structure of the first slope layer 313a' may be directed toward a protrusion portion of the pixel-defining layer 180 between the green pixel electrode 220G and the red pixel electrode 220R. The second guided light Lf12' may be incident to the opposite electrode 230. Therefore, second reflected light Lf12" reflected by a portion of the opposite electrode 230 adjacent to the non-pixel area NPA may be more easily absorbed by a light-absorbing pattern of the light-shielding layer 400 in the non-pixel area NPA.

Frontal light Lf2 incident to the non-pixel area NPA may be absorbed by the light-absorbing pattern of the light-shielding layer 400. Thus, frontal light Lf2 might not penetrate into the display device 20.

Although the frontal light L2 is described with referent to FIG. 4, lateral light incident to the pixel area PAG may be reflected by the opposite electrode 230. Lateral light may be absorbed by the light-absorbing pattern of the light-shielding layer 400. Lateral light incident to the non-pixel area NPA may be absorbed by the light-absorbing pattern of the light-shielding layer 400 before penetrating into the display device 20. Since external light incident to the pixel area PAG and external light incident to the non-pixel area NPA may be substantially absorbed by the light-absorbing pattern of the light-shielding layer 400 in the non-pixel area NPA, reflectivity of the entire display device 20 may be reduced. A difference in reflectivity between the pixel area PAG and the non-pixel area NPA may be reduced. Consequently, the display device 20 may display a relatively high brightness image over substantially the entire surface thereof.

Figure 7:
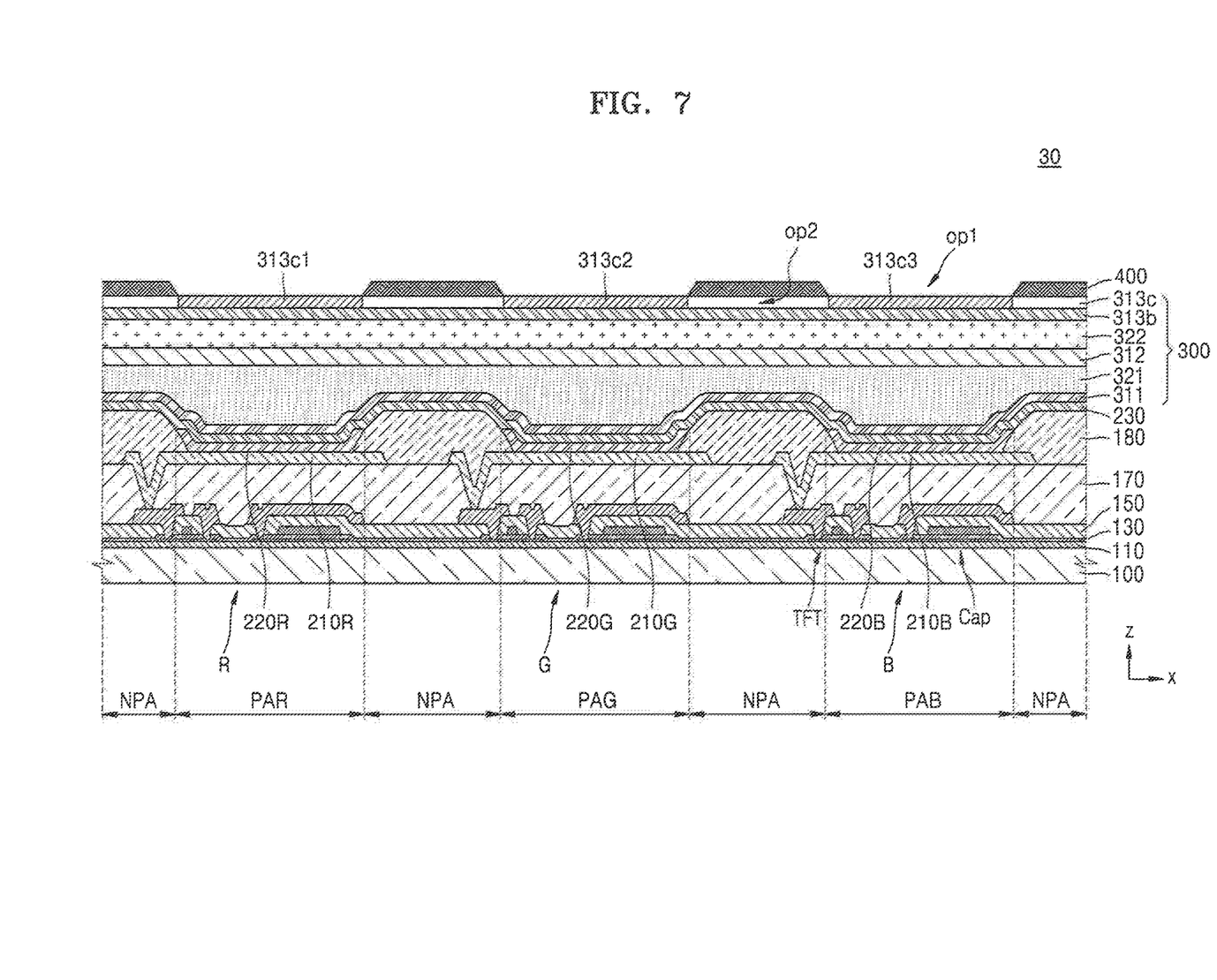
FIG. 7 is a cross-sectional view illustrating a display device according to an exemplary embodiment of the present invention.

FIG. 7 is a cross-sectional view illustrating a display device according to an exemplary embodiment of the present invention.

Referring to FIG. 7, a display device 30 may include the substrate 100, the plurality of pixel electrodes 210R, 210G, and 210B, the encapsulation layer 300, and the light-shielding layer 400. A first inorganic layer 313c of the encapsulation layer 300 most adjacent to the light-shielding layer 400 may include a plurality of second openings OP2. The display device 30 described with reference to FIG. 7 may be substantially the same as the display device 10 described above with reference to FIGS. 1 to 3, and thus duplicative descriptions may be omitted below, and differences between the display device 30 and the display device 10 may be focused on below.

The display device 30 may include a plurality of inorganic patterns 313c1, 313c2, and 313c3. Each of the inorganic patterns 313c1, 313c2, and 313c3 may include a plurality of fine pillar patterns. The fine pillar patterns may be spaced apart from each other. Since the light-absorbing pattern of the light-shielding layer 400 may be disposed in the non-pixel area NPA, the inorganic patterns 313c1, 313c2, and 313c3 each including the fine pillar patterns might not be disposed below the light-shielding layer 400. However, inducement of reflected light may progress light toward the light-absorbing pattern of the light-shielding layer 400. The inducement of reflected light may be induced by the inorganic patterns 313c1, 313c2, and 313c3 each including the fine pillar patterns in the pixel areas PAR, PAG, and PAB. Therefore, the display device 30 according to an exemplary embodiment of the present invention may have a structure in which the fine pillar patterns are positioned only in the pixel areas PAR, PAG, and PAB. With this structure, an amount of the deposition material may be reduced. Since the second opening OP2 may be positioned below the light-absorbing pattern of the light-shielding layer 400 and the thickness of the encapsulation layer 300 is partially reduced, an absorption rate of reflected light from below the light-shielding layer 400 to the light-absorbing pattern may be increased.

Though the disclosure has been described with reference to the exemplary embodiments of the present invention illustrated in the drawings, it will be understood by those of ordinary skill in the art that various changes in form and details and equivalents thereof may be made therein without departing from the spirit and scope of the present invention.

What is claimed is:

1. A display device, comprising:
a substrate;
a pixel electrode positioned above the substrate;
an encapsulation layer disposed above the pixel electrode and comprising a first inorganic layer, the first inorganic layer comprising a plurality of fine pillar patterns sloping with respect to one surface of the substrate, wherein the first inorganic layer comprises a first slope layer and a second slope layer, wherein the first slope layer comprises a plurality of first fine pillar patterns, and the second slope layer comprises a plurality of second fine pillar patterns; and
a light-shielding layer disposed on the encapsulation layer and comprising a first opening, the first opening overlapping at least a portion of the pixel electrode.

2. The display device of claim 1, wherein the encapsulation layer comprises at least one inorganic layer comprising the first inorganic layer, and wherein the first inorganic layer is adjacent to the light-shielding layer.

3. The display device of claim 1, wherein the first inorganic layer comprises silicon oxide.

4. The display device of claim 1, wherein the first inorganic layer has a refractive index ranging from about 1.0 to about 1.5.

5. The display device of claim 1, wherein the first inorganic layer is porous.

6. The display device of claim 1, wherein the encapsulation layer further comprises a second inorganic layer, and wherein the second inorganic layer is in direct contact with the first inorganic layer.

7. The display device of claim 6, wherein the second inorganic layer has a refractive index greater than a refractive index of the first inorganic layer.

8. The display device of claim 6, wherein the second inorganic layer is less porous than the first inorganic layer.

9. The display device of claim 6, wherein the second inorganic layer includes silicon nitride, titanium oxide, tantalum oxide, zirconium oxide, aluminum oxide, silicon oxide, silicon oxynitride, aluminum oxynitride, aluminum oxynitride, zinc oxide, or any combination thereof.

10. The display device of claim 1, wherein the first slope layer and the second slope layer each have a stacked structure, and the first fine pillar patterns have a slope direction different from a slope direction of the second fine pillar patterns.

11. The display device of claim 10, wherein a first fine pillar pattern of the first fine pillar patterns and a second fine pillar pattern of the second fine pillar patterns form a V-shape with each other.

12. The display device of claim 10, wherein the first fine pillar patterns and the second fine pillar patterns are substantially symmetrically arranged around a boundary surface, the boundary surface disposed between the first slope layer and the second slope layer.

13. The display device of claim 10, wherein the first fine pillar patterns or the second fine pillar patterns have a slope angle ranging from about 45 degrees to about 80 degrees with respect to the one surface of the substrate.

14. The display device of claim 1, wherein the light-shielding layer comprises a light-absorbing material.

15. A method of manufacturing a display device, the method comprising:
arranging a pixel electrode above a substrate;
forming a first inorganic layer comprising a plurality of fine pillar patterns above the pixel electrode, the plurality of fine pillar patterns sloping with respect to one surface of the substrate, wherein forming of the first inorganic layer comprises forming the fine pillar patterns by performing a deposition method at a first predetermined slope incident angle and at a second predetermined slope incident angle, different from the first predetermined slope incident angle, on the one surface of the substrate; and
forming a light-shielding layer on the first inorganic layer, the light-shielding layer comprising a first opening, the first opening overlapping at least a portion of the pixel electrode.

16. The method of claim 15, further comprising forming a second inorganic layer over or below the first inorganic layer such that the second inorganic layer in direct contact with the first inorganic layer, wherein
the first inorganic layer comprises silicon oxide, and
the second inorganic layer comprises silicon nitride, titanium oxide, tantalum oxide, zirconium oxide, aluminum oxide, silicon oxide, silicon oxynitride, aluminum oxynitride, aluminum oxynitride, zinc oxide, or a combination thereof.

17. The method of claim 15, wherein the first predetermined slope incident angle is in a range of about 45 degrees or more and about 80 degrees or less.

18. The method of claim 15, wherein the first inorganic layer has a refractive index ranging from about 1.0 to about 1.5.

* * * * *